(12) United States Patent
Segawa et al.

(10) Patent No.: US 8,035,188 B2
(45) Date of Patent: Oct. 11, 2011

(54) SEMICONDUCTOR DEVICE

(75) Inventors: Hiroaki Segawa, Osaka (JP); Masanori Hirofuji, Osaka (JP)

(73) Assignee: Panasonic Corporation, Osaka (JP)

( * ) Notice: Subject to any disclaimer, the term of this patent is extended or adjusted under 35 U.S.C. 154(b) by 404 days.

(21) Appl. No.: 11/658,738

(22) PCT Filed: May 30, 2005

(86) PCT No.: PCT/JP2005/009858
§ 371 (c)(1),
(2), (4) Date: Jan. 29, 2007

(87) PCT Pub. No.: WO2006/011292
PCT Pub. Date: Feb. 2, 2006

(65) Prior Publication Data
US 2009/0001364 A1    Jan. 1, 2009

(30) Foreign Application Priority Data

Jul. 28, 2004  (JP) ................................. 2004-220794

(51) Int. Cl.
*H01L 21/70* (2006.01)
(52) U.S. Cl. ................................. 257/499; 257/E27.001
(58) Field of Classification Search .................... 257/48, 257/499, E27.001
See application file for complete search history.

(56) References Cited

U.S. PATENT DOCUMENTS

| 5,045,919 | A | | 9/1991 | Nagaoka |
| 5,300,796 | A | | 4/1994 | Shintani |
| 5,404,099 | A | * | 4/1995 | Sahara ........................ 324/158.1 |
| 7,061,263 | B1 | * | 6/2006 | Ong ................................ 324/765 |
| 2003/0173667 | A1 | * | 9/2003 | Yong et al. .................... 257/748 |
| 2003/0222274 | A1 | * | 12/2003 | Shiina ............................ 257/173 |

FOREIGN PATENT DOCUMENTS

| JP | 1-112750 | | 5/1989 |
| JP | 2-10854 | | 1/1990 |
| JP | 3-99445 | | 4/1991 |
| JP | 5-291368 | | 11/1993 |
| JP | 9-8141 | | 1/1997 |
| JP | 09008141 | * | 1/1997 |
| JP | 10-65103 | | 3/1998 |
| JP | 10065103 | * | 3/1998 |
| JP | 10065103 A | * | 3/1998 |
| JP | 2000-31223 | | 1/2000 |
| JP | 2003-248704 | | 9/2003 |

* cited by examiner

Primary Examiner — Zandra Smith
Assistant Examiner — Jamie C Niesz
(74) *Attorney, Agent, or Firm* — McDermott Will & Emery LLP

(57) ABSTRACT

Plural I/O cells (14) having electrode pads for wire bonding (13) are disposed with spaces (55) between them in the vicinity of a corner of an I/O region (11) of a semiconductor substrate (10), and power supply separation cells (16) not to be wire bonded, on which ESD (electrostatic discharge) protection circuits (4) having ESD protection transistors are amounted, are disposed between the respective I/O cells (14), whereby the chip size is reduced upon consideration of layout of the electrode pads.

6 Claims, 7 Drawing Sheets

US 8,035,188 B2

SEMICONDUCTOR DEVICE

RELATED APPLICATIONS

This application is the U.S. National Phase under 35 U.S.C. §371 of International Application No. PCT/JP2005/009858, filed on May 30, 2005, which in turn claims the benefit of Japanese Application No. 2004-220794, filed on Jul. 28, 2004, the disclosures of which Applications are incorporated by reference herein.

TECHNICAL FIELD

The present invention relates to a semiconductor device having an integrated circuit, and more particularly, to a layout of electrode pads in the integrated circuit of the semiconductor device.

BACKGROUND ART

In a conventional semiconductor device, reduction of a core region that is a region other than an I/O (Input/Output) region is possible with miniaturization of semiconductor technology node. However, the chip size of the semiconductor device cannot be reduced correspondingly to the reduced core region. The reasons are as follows.

(1) Since the electrode pads of the integrated circuit, which are disposed in the I/O region, are not so much decreased while the circuit in the core region can be reduced, the chip size would be undesirably determined depending on the electrode pads disposed in the I/O region.

(2) While the layout of the integrated circuit is carried out using cells, in order to prevent wires from contacting the cells during plastic molding that is performed after wire bonding, it is necessary to secure the spaces between the adjacent electrode pads in the vicinity of the corner of the semiconductor chip, which are larger than those in cases where the cells including the electrode pads are closely arranged, as a restriction on assembly.

(3) When initial failures of semiconductor devices should be eliminated by performing an acceleration test in wafer level (hereinafter referred to as "wafer level burn-in" (WLBI)), in order to perform reliable contact to the cells by using such as a probe for supplying signal and current for WLBI to the semiconductor devices, it is required to dispose WLBI pads which are larger than the electrode pads for wire bonding for normally operating the semiconductor devices, on the semiconductor device. Further, when these plural WLBI pads are adjacently disposed on the semiconductor devices, large spaces must be secured between the respective WLBI pads. This results in a restriction on WLBI.

FIG. 11 is a schematic diagram illustrating a layout of a corner portion of the conventional semiconductor device.

As shown in FIG. 11, in the corner portion of the conventional semiconductor device, an I/O region 51 and a core region 52 are provided on a semiconductor substrate 50.

A plurality of cells 54 having electrode pads for I/O 53, which are parts of the integrated circuit, are disposed in the I/O region 51, while the integrated circuit and other circuits are disposed in the core region 52. The I/O region 51 is provided along the periphery of the semiconductor substrate 50, and a corner cell 57 is disposed in a corner portion of the semiconductor substrate 50. The core region 52 is disposed in the center of the semiconductor substrate 50. The electrode pads 53 are pads for performing wire bonding with the outside, and the adjacent electrode pads 53 are disposed with a space 55 between them, and this space 55 is set to a value that satisfies the above-mentioned restriction on assembly.

For example, in order to keep the restriction on assembly in designing the semiconductor device, it is necessary to secure a space 55a between the adjacent electrode pads, for example, 53a and 53b, as shown in FIG. 11. Thereby, the wires connected to the electrode pads are prevented from contacting each other during plastic molding, and reduction in the yield is avoided. However, since the chip size is undesirably determined by the space 55 between the adjacent electrode pads 53 which is determined by the restriction on assembly, it is difficult to minimize the chip size even when micro processing is used.

FIG. 12 is a schematic diagram illustrating a layout of a periphery portion of another conventional semiconductor device.

In FIG. 12, the same reference numerals as those shown in FIG. 11 denote the same or corresponding parts. In an I/O region 51 at the periphery of the semiconductor substrate 50, two I/O cells for WLBI 80 having electrode pads for WLBI 81 are disposed with a space 88 between them. This space 88 is set to a value that satisfies the above-mentioned WLBI restriction.

The WLBI is an acceleration test that is performed to eliminate initial defectives, prior to the assembly processes for semiconductor chips, such as wire bonding and plastic molding. By performing this acceleration test, reduction in the assembly cost can be achieved. Usually, in the WLBI, plural semiconductor devices fabricated on a wafer are kept at a high temperature in the wafer state, and humidified, and further, held under the state where a power supply voltage and signals such as a clock signal are applied to the respective chips of the semiconductor devices, thereby deteriorating the semiconductor devices. Therefore, it is necessary to fabricate a signal application probe card for applying the above-mentioned signals during the WLBI, and there also exists a restriction on layout of the electrode pads for WLBI to fabricate the probe card without failures and make accurate contacts with the respective chips on the wafer. To be specific, as shown in FIG. 12, an electrode pad having a size larger than the standard-size electrode pad to be wire bonded, usually, having a width about 30% larger than that of the electrode pad for wire bonding, is used as the pad for WLBI 81. Further, when plural pads for WLBI 81 are disposed, it is necessary to secure a space 88 between the adjacent pads.

Patent Document 1: Japanese Published Patent Application No. 3-99445.

DISCLOSURE OF THE INVENTION

Problems to be Solved by the Invention

As described above, in the conventional semiconductor device, even when the micro processing is adopted for chip size reduction, the chip size is undesirably determined by the restrictions on the layout of the electrode pads required for the fundamental operation of the integrated circuits of the semiconductor device or the electrode pads required for WLBI, such as the restriction on assembly or the restriction on WLBI. Consequently, it becomes difficult to reduce the chip size, and the merit of adopting the micro processing is degraded.

The present invention is made to solve the above-described problems and has for its object to provide a semiconductor device whose chip size can be reduced by considering the layout of electrode pads.

Measures to Solve the Problems

According to the present invention, there is provided a semiconductor device having an integrated circuit on a semiconductor substrate, wherein plural electrode pads for wire bonding are disposed with predetermined spaces between them, along the periphery of the semiconductor substrate in the vicinity of the corners thereof; and constituent elements of the integrated circuit, which are not wire bonded, are disposed in the spaces between the respective electrode pads for wire bonding.

Further, in the above-mentioned semiconductor device, an electrode pad to be selectively wire bonded to one of the plural electrode pads for wire bonding is disposed close to the electrode pad for wire bonding.

Further, according to the present invention, there is provided a semiconductor device having an integrated circuit on a semiconductor substrate, wherein plural electrode pads for acceleration test are disposed with predetermined spaces between them, along the periphery of the semiconductor substrate; and constituent elements of the integrated circuit are disposed in the spaces between the respective electrode pads for acceleration test.

Further, in the above-mentioned semiconductor device, the integrated circuit constituent elements that are disposed between the respective electrode pads for acceleration test are electrode pads for wire bonding.

Further, according to the present invention, there is provided a semiconductor device having an integrated circuit on a semiconductor substrate, wherein one electrode pad for acceleration test is disposed along the periphery of the semiconductor substrate so that the electrode pad is connected to plural circuits in the integrated circuit which are designed so as to be supplied with different powers or signals; and one electrode pad for wire bonding to be connected to the plural circuits is disposed close to the one electrode pad for acceleration test, along the periphery of the semiconductor substrate.

Further, the above-mentioned semiconductor device includes a test start signal generation circuit for generating a test start signal which instructs start of acceleration test for the plural circuits; and a delay circuit for delaying the generated test start signal; wherein the plural circuits include a first circuit to which the test start signal from the test start signal generation circuit is inputted, and a second circuit to which the test start signal delayed by the delay circuit is inputted, and the first circuit and the second circuit operate in different time zones during the acceleration test.

Further, according to the present invention, there is provided a semiconductor device having an integrated circuit on a semiconductor substrate, wherein plural electrode pads for wire bonding are disposed adjacent to each other at positions apart from corners of the semiconductor substrate, along the periphery of the semiconductor substrate; and plural electrode pads for acceleration test are disposed with predetermined spaces between them, along the periphery of the semiconductor substrate in the vicinity of the corners.

Effects of the Invention

According to the present invention, plural electrode pads for wire bonding are disposed with predetermined spaces between them along the periphery of a semiconductor substrate in the vicinity of corners thereof, and constituent elements of the integrated circuit, which are not wire bonded, are disposed in the spaces between the respective electrode pads for wire bonding. Therefore, the length of each side of the semiconductor substrate can be shortened by an amount corresponding to the widths of the integrated circuit constituent elements that are not wire bonded, thereby reducing the chip size with the space between the adjacent electrode pads being maintained, without causing inconvenience in wire bonding of the electrode pads.

Further, an electrode pad to be selectively wire bonded to one of the plural electrode pads for wire bonding is disposed close to the electrode pad for wire bonding. Therefore, the method of assembling the semiconductor device can be selected, and further, the length of each side of the semiconductor substrate can be shortened by an amount equivalent to the width corresponding to the space between the closely disposed electrode pads, thereby reducing the chip size of the semiconductor device.

Further, plural electrode pads for acceleration test are disposed with predetermined spaces between them along the periphery of the semiconductor substrate, and the integrated circuit constituent elements are disposed between the respective electrode pads for acceleration test. Therefore, the length of each side of the semiconductor substrate can be shortened by an amount corresponding to the widths of the constituent elements of the integrated circuit, thereby reducing the chip size with the space between the adjacent electrode pads for acceleration test being maintained.

Further, the integrated circuit constituent elements that are disposed between the respective electrode pads for acceleration test are electrode pads for wire bonding. Therefore, the length of each side of the semiconductor substrate can be shortened by an amount corresponding to the widths of the electrode pads for wire bonding, thereby reducing the chip size with the space between the adjacent electrode pads for acceleration test being maintained, without causing inconvenience in wire bonding of the electrode pads.

Further, according to the present invention, one electrode pad for acceleration test is disposed along the periphery of the semiconductor substrate so that the electrode pad is connected to plural circuits in the integrated circuit which are designed so as to be supplied with different powers or signals, and one electrode pad for wire bonding to be connected to the plural circuits is disposed close to the one electrode pad for acceleration test, along the periphery of the semiconductor substrate. Therefore, the space between the electrode pad for acceleration test and the electrode pad for wire bonding can be reduced, thereby reducing the chip size.

Further, the above-mentioned semiconductor device includes a test start signal generation circuit for generating a test start signal which instructs start of acceleration test for the plural circuits, and a delay circuit for delaying the generated test start signal, and the plural circuits include a first circuit to which the test start signal from the test start signal generation circuit is inputted, and a second circuit to which the test start signal delayed by the delay circuit is inputted, and the first circuit and the second circuit operate in different time zones during the acceleration test. Therefore, the amount of current flowing through the acceleration test electrode pads during the acceleration test is controlled to satisfy the allowable current amount for the pads, thereby preventing breakage of the semiconductor device such as destruction of the power supply wiring, and enhancing the operation reliability.

Further, according to the present invention, plural electrode pads for wire bonding are disposed adjacent to each other at positions apart from corners of the semiconductor substrate, along the periphery of the semiconductor substrate, and plural electrode pads for acceleration test are disposed with predetermined spaces between them along the periphery of the semiconductor substrate in the vicinity of the corners. Therefore, the length of each side of the semiconductor substrate can be shortened by an amount corresponding to the width of the space between the electrode pads that are closely disposed, while simultaneously satisfying the restriction on assembly as well as the restriction on WLBI.

DESCRIPTION OF REFERENCE NUMERALS

Figure 1:
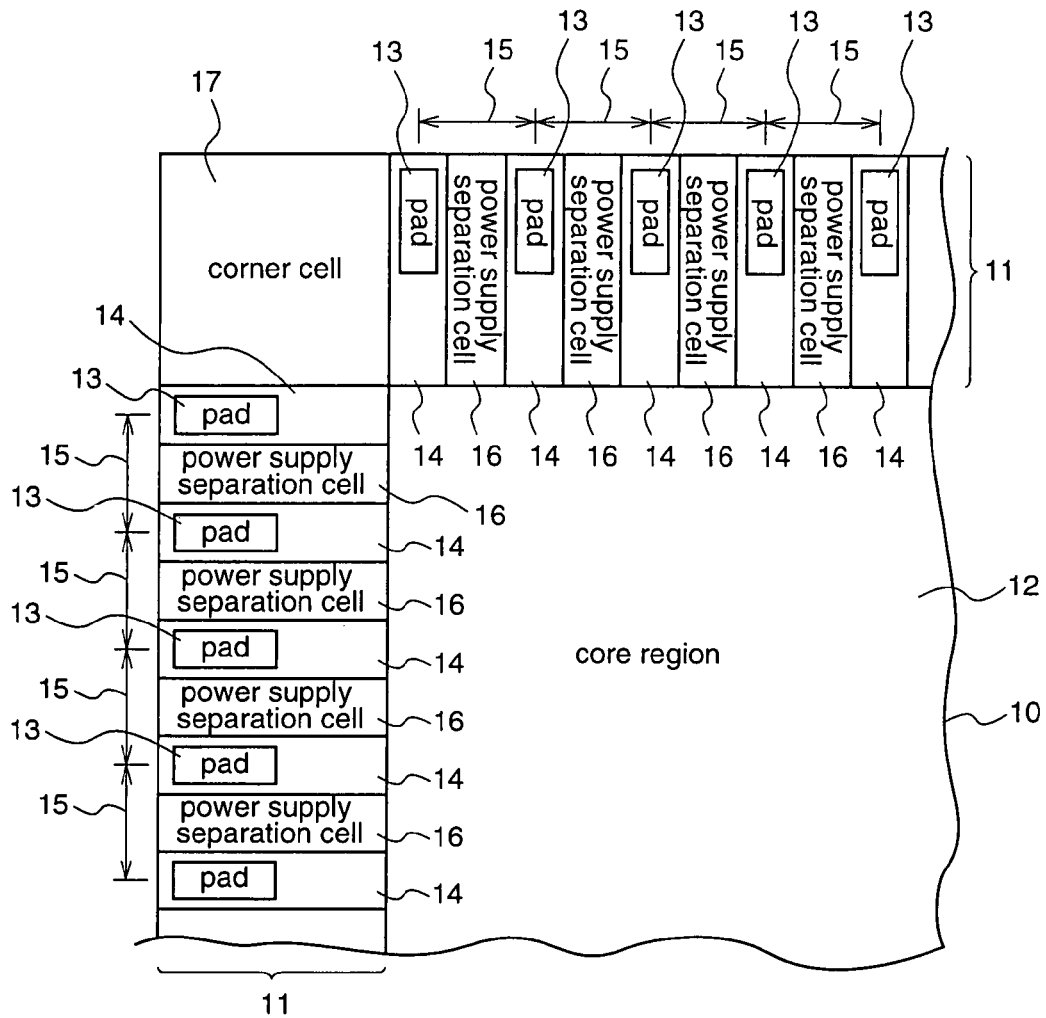
FIG. 1 is a schematic layout diagram illustrating a corner portion of a semiconductor device according to a first embodiment of the present invention.

10 . . . semiconductor substrate
11 . . . I/O region
12 . . . core region
13,13a,13b,21,31,91 . . . electrode pad
14,14a,14b,20,30,90 . . . I/O cell
15,77 . . . space between cells
16,76 . . . power supply separation cell
22a,22b . . . buffer
23,32,41a,41b . . . wiring
40 . . . ESD protection circuit
70,70a,70b . . . WLBI I/O cell
71,71a,71b . . . WLBI pad
101 . . . first circuit block
102 . . . second circuit block
200 . . . test start signal generation circuit
210 . . . delay circuit
220 . . . test start signal

BEST MODE TO EXECUTE THE INVENTION

Embodiment 1

FIG. 1 is a schematic diagram illustrating a layout of a corner portion of a semiconductor device according to a first embodiment of the present invention.

In FIG. 1, plural I/O cells 14 having electrode pads 13 and plural power supply separation cells are disposed in an I/O region 11 on a semiconductor substrate 10, and constituent elements of the integrated circuit other than the I/O cells 14 and the power supply separation cells 16 disposed in the I/O region 11 are disposed in a core region 12.

The I/O region 11 is a region along the periphery of the semiconductor substrate 10, wherein the circuit elements of the integrated circuit that relate to input/output are mainly disposed, and plural electrode pads 13 and plural power supply separation cells 16 are disposed in the I/O region 11. A corner cell 17 is disposed in the corner portion of the semiconductor substrate 10.

The electrode pads 13 are pads for connecting the semiconductor device with the outside by wire bonding, and these pads 13 are disposed along the periphery of the semiconductor substrate 10. In the vicinity of the corner of the semiconductor substrate 10, the respective electrode pads 13 are disposed with spaces 15, and this space 15 is set at a value which can prevent the wires that are wire-bonded to the electrode pads 13 from touching each other, i.e., from mutually contacting, when performing plastic molding after wire bonding, that is, it is set at a value that satisfies the restriction on assembly, or more.

Each of the plural power supply separation cells 16 is disposed in the space between the adjacent electrode pads 13, and contacts the I/O cell 14 having the electrode pad 13. The width of the electrode pad 13, i.e., the length thereof along the side of the semiconductor substrate 19, is set at about 90% of the width of the I/O cell 14. This width is set according to needs in design or the like.

The core region 12 is a region wherein the constituent elements of the integrated circuit other than the I/O cells 14 and the power supply separation cells 16 that are disposed in the I/O region 11 are disposed, and it is provided in the center of the semiconductor substrate 10.

The detailed construction of the core region 12, the detailed constructions of the constituent elements of the integrated circuit other than the I/O cells and the power supply separation cells 16, the connection relationships between these constituent elements and the I/O cells or the power supply separation cells 16, and the connections between these constituent elements, will be omitted in this first embodiment.

Figure 2:
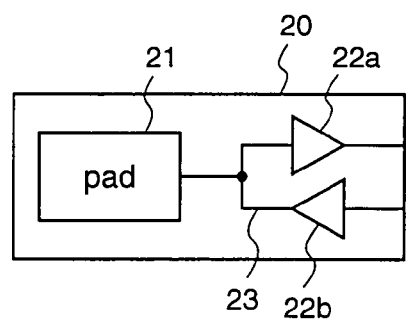
FIG. 2 is a schematic diagram illustrating an example of an I/O cell of the semiconductor device according to the first embodiment of the present invention.

FIG. 2 is a diagram illustrating an example of an I/O cell including an electrode pad to be wire-bonded, in the semiconductor device according to the first embodiment of the present invention.

As shown in FIG. 2, the I/O cell 20 is provided with an electrode pad 21 to be wire-bonded, an I/O wiring 23 connected to the electrode pad 21, and a buffer 22a and a buffer 22b inserted in the I/O wiring 23. The buffer 22a performs noise removal and level shift to a signal outputted to the electrode pad 21, and the buffer 22b performs noise removal and level shift to a signal supplied from the electrode pad 21. This I/O cell 20 is used for input/output of a digital signal. For example, when this I/O cell 20 is used as the I/O cell 14 in the semiconductor device shown in FIG. 1, the electrode pad 21 corresponds to the electrode pad 13.

Figure 3:
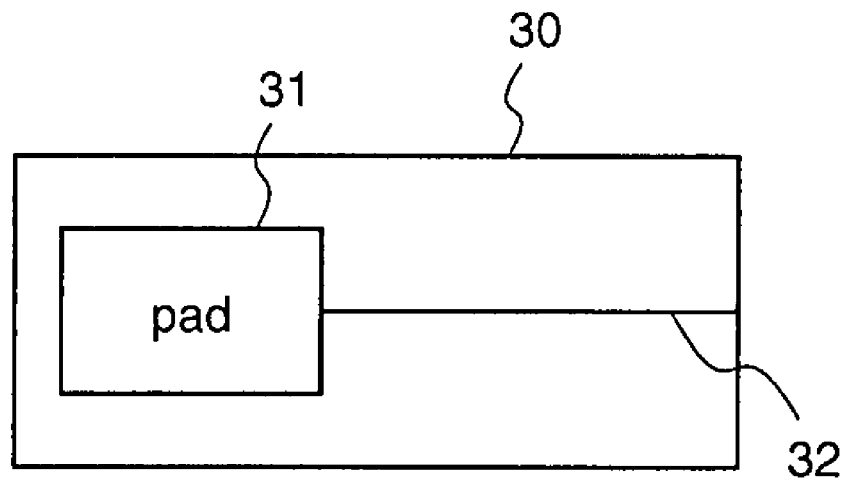
FIG. 3 is a schematic diagram illustrating another example of an I/O cell of the semiconductor device according to the first embodiment of the present invention.

FIG. 3 is a diagram illustrating another example of an I/O cell including an electrode pad to be wire bonded, in the semiconductor device according to the first embodiment of the present invention.

As shown in FIG. 3, the I/O cell 30 is provided with an electrode pad to be wire bonded 31, and a wiring 32 connected to the electrode pad 31. This I/O cell 30 is used for input/output of the power supply. For example, when this I/O cell 30 is used as the I/O cell 14 in the semiconductor device shown in FIG. 1, the electrode pad 31 corresponds to the electrode pad 13.

Figure 4:
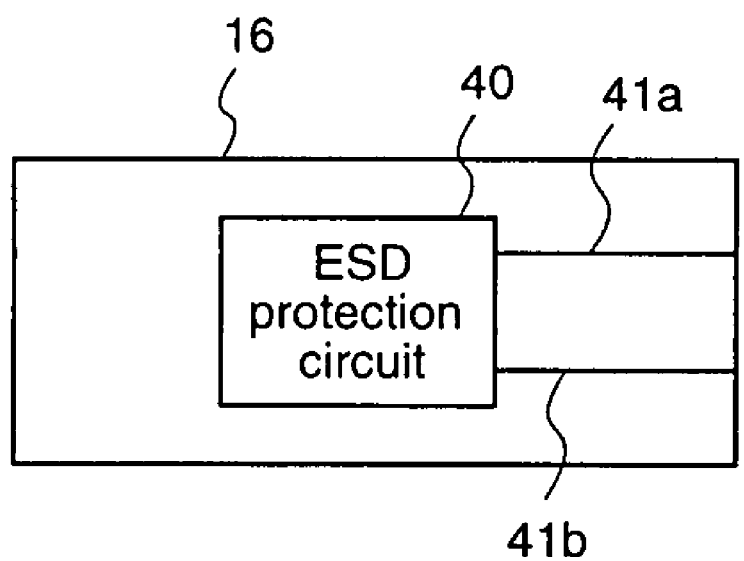
FIG. 4 is a schematic diagram illustrating a power supply separation cell of the semiconductor device according to the first embodiment of the present invention.

FIG. 4 is a diagram illustrating the construction of the power supply separation cell of the semiconductor device according to the first embodiment of the present invention.

As shown in FIG. 4, the power supply separation cell 16 is provided with an ESD protection circuit 40 having an ESD (electrostatic discharge) protection transistor, an input wiring 41a and an output wiring 41b for the ESD protection circuit 40. The ESD protection circuit 40 has a transistor for protection from electrostatic breakdown, which is disposed between the power supply of the integrated circuit and the ground, and there occurs no exchange of signals and voltages with outside of the semiconductor device. Therefore, the power supply separation cell 16 requires neither an I/O pad nor wire bonding.

Usually, in the case of a semiconductor device having plural power supplies and ground systems, in which digital circuits and analog circuits are integrated, the power supply separation cells 16 having the ESD protection transistors as shown in FIG. 4 are often provided between these power supplies and grounds. In this case, the circuits that require no wire bonding such as the power supply separation cells 16 are often disposed in the I/O region 11.

In this first embodiment, a region that is sandwiched between the I/O cells 14 in the vicinity of the corner of the semiconductor substrate 10, which region has originally been an unused region, is effectively utilized such that the power supply separation cells 16 which have been disposed in the area on the I/O region other than the vicinity of the corner of the semiconductor substrate 10 are disposed between the respective I/O cells 14 in the vicinity of the corner of the semiconductor substrate 10. Thereby, the number of the power supply separation cells 16 that are disposed in the area on the I/O region 11 other than the vicinity of the corner of the semiconductor substrate 10 can be reduced, whereby the integration density of the constituent elements of the integrated circuit in the I/O region 11 can be increased. Further, the length of each side of the semiconductor substrate 10 can be reduced by the widths of the power supply separation cells 16 that are disposed between the respective I/O cells 14.

Since the power supply separation cell 16 requires no wire bonding for connecting the same with the outside, even when it is disposed close to the electrode pad 13 that requires wire bonding, undesirable contact of wires does not occur between the power supply separation cell 16 and the electrode pad 13 during plastic molding.

As described above, according to the first embodiment, the plural electrode pads for wire bonding 13 are disposed with the spaces 15 between them along the periphery of the semiconductor substrate 10 in the vicinity of the corner thereof, and the power supply separation cells 16 that are not wire bonded are disposed in the spaces between the respective electrode pads for wire bonding 13. Therefore, the integration density of the I/O region at the periphery of the semiconductor substrate 10 is increased while preventing contact of the wires when the electrode pads 13 are wire bonded, whereby the length of each side of the semiconductor substrate 10 can be shortened, resulting in a reduction in the chip size.

While in this first embodiment the I/O cell 20 shown in FIG. 2 or the I/O cell 30 shown in FIG. 3 is used as an example of a cell having an electrode pad for wire bonding, the present invention is not restricted thereto, and a cell of any construction may be disposed so long as it has an electrode pad that needs wire-bonding with the outside. Also in this case, the same effects as described for the first embodiment can be achieved.

Further, while in this first embodiment the power supply separation cell 16 shown in FIG. 4 is used as a power supply separation cell, the present invention is not restricted thereto, and a power supply separation cell of any construction may be disposed so long as it has no electrode pad for wire bonding. Also in this case, the same effects as described for the first embodiment can be achieved.

Furthermore, while in this first embodiment the power supply separation cell 16 is disposed between the electrode pads 13, the present invention is not restricted thereto, and any cell among the cells of the semiconductor device may be disposed so long as it has no electrode pad for wire bonding. Also in this case, the same effects as described for the first embodiment can be achieved.

For example, in this first embodiment, instead of the power supply separation cell, a cell having an electrode pad that is not wire bonded with the outside may be disposed, with the same effects as described for the first embodiment.

Embodiment 2

Figure 5:
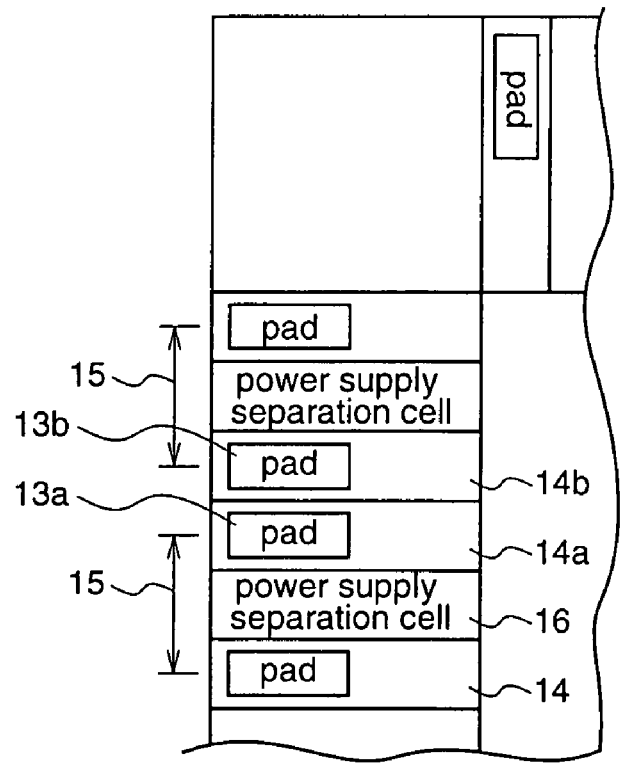
FIG. 5 is a schematic layout diagram illustrating a corner portion of a semiconductor device according to a second embodiment of the present invention.

FIG. 5 is a schematic diagram illustrating a layout of a corner portion of a semiconductor device according to a second embodiment of the present invention. In FIG. 5, the same reference numerals as those shown in FIG. 1 designate the same or corresponding parts. In the semiconductor device according to the second embodiment, one of the I/O cells 14 including the electrode pads 13 which is disposed in the corner of the semiconductor device according to the first embodiment is replaced with an I/O cell 14a and an I/O cell 14b to be selectively used, which are disposed adjacent to each other.

When an electrode pad 13a in the I/O cell 14a and an electrode pad 13b in the I/O cell 14b are wire bonded to the outside, these pads are not simultaneously connected to the wire, but only one of them is selectively wire bonded.

For example, in a semiconductor device for performance evaluation, two I/O cells 14a and 14b having different current supply capabilities are provided, and a wire is selectively bonded to these cells to constitute a semiconductor device, whereby it is possible to perform evaluation as to which I/O cell can be appropriately used. At this time, since the selectively used I/O cell 14a and I/O cell 14b are not simultaneously wire bonded, there occurs no problem such as wire touch between these cells after wire bonding, and therefore, these two cells can be disposed close to each other. That is, the electrode pads to be selectively used can be disposed adjacent to each other. Thereby, it becomes unnecessary to secure a space between the I/O cell 14a and the I/O cell 14b.

As described above, according to the second embodiment, since the electrode pads that are selectively wire bonded and used are disposed adjacent to each other, the method of assembling the semiconductor device can be selected, and further, the space between these electrode pads can be reduced, whereby the chip size of the semiconductor device can be reduced.

Embodiment 3

Figure 6:
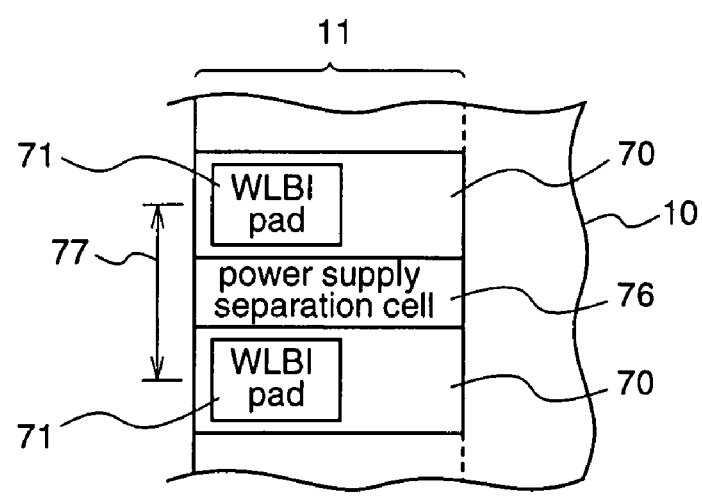
FIG. 6 is a schematic layout diagram illustrating a peripheral portion of a semiconductor device according to a third embodiment of the present invention.

FIG. 6 is a schematic layout diagram illustrating a peripheral portion of a semiconductor device according to a third embodiment of the present invention. In FIG. 6, the same reference numerals as those shown in FIG. 1 designate the same or corresponding parts, and two I/O cells for WLBI 70 having electrode pads for WLBI 71 are disposed with a space 77 between them in an I/O region 11 at the periphery of a semiconductor substrate 50, and further, a power supply separation cell 76 similar to that described in the first embodiment is disposed on a region sandwiched between the WLBI I/O cells 70.

When performing WLBI, a signal application probe card for applying a signal for acceleration test is required, and it is necessary to satisfy the restriction on the layout of the WLBI pads 71, considering the restriction on the construction of the probe card. That is, the two WLBI pads 71 must be disposed with a predetermined space between them, and this space 77 is set at a value that satisfies the restriction on the WLBI pads 71, or more.

In this third embodiment, a region that is sandwiched between the WLBI I/O cells 70, which has originally been an unused region, is effectively utilized such that the power supply separation cell 76 is disposed between the WLBI I/O cells 70, whereby the number of the power supply separation cells 16 that are disposed in the region other than the region between the WLBI I/O cells 70 on the I/O region 11 can be reduced, and consequently, the integration density of the constituent elements of the integrated circuit on the I/O region 11 is increased, and the length of each side of the semiconductor substrate 10 can be shortened by the width of the power supply separation cell 76 disposed between the WLBI I/O cells 70.

As described above, according to the third embodiment, the plural electrode pads for wire bonding 71 are disposed with the spaces 77 between them, and the power supply separation cells 76 that are not wire bonded are disposed between the respective electrode pads 71. Therefore, the integration density of the I/O region at the periphery of the semiconductor substrate 10 can be increased, and the length of each side of the semiconductor substrate 10 can be shortened, leading to a reduction in the chip size.

While in this third embodiment two WLBI pads 71 are provided, three or more WLBI pads may be provided and the power supply separation cells may be disposed between the respective WLBI pads. Also in this case, the same effects as described for the third embodiment can be achieved.

Embodiment 4

Figure 7:
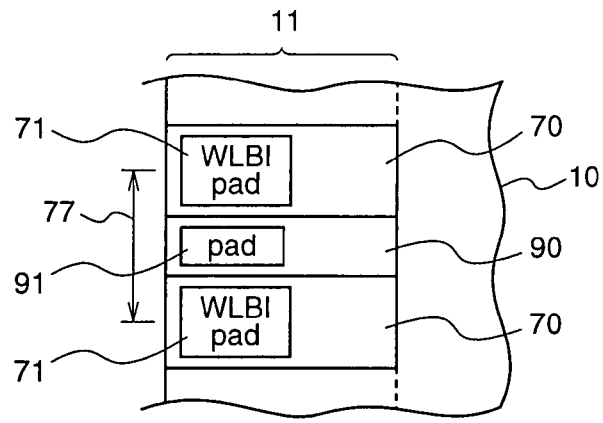
FIG. 7 is a schematic layout diagram illustrating a peripheral portion of a semiconductor device according to a fourth embodiment of the present invention.

FIG. 7 is a schematic diagram illustrating a layout of a peripheral portion of a semiconductor device according to a fourth embodiment of the present invention. In FIG. 7, the same reference numerals as those shown in FIG. 6 designate the same or corresponding parts. This semiconductor device is obtained by replacing the cell disposed between the two WLBI pads 71 in the semiconductor device according to the third embodiment, with an I/O cell 90 having an electrode pad 91 to be wire bonded. Further, the WLBI pad 71 of this fourth embodiment contacts an electrode during acceleration test, while it does not contact the electrode and is not wire bonded during assembly.

Since the electrode pad 91 is not wire bonded in the wafer state, even when the electrode pad 91 is disposed close to the WLBI pad 71, it does not become an obstacle to WLBI. Further, since the WLBI pad 71 is not wire bonded, there occurs no problem such as wire touch to the wire bonded to the electrode pad 91. Therefore, the electrode pad 91 which is originally to be disposed in the area on the I/O region 11 other than between the WLBI I/O cells 70 and requires wire bonding can be disposed between the WLBI I/O cells 70, whereby the integration density of the constituent elements of the integrated circuit on the I/O region 11 is increased, resulting in the same effects as those described in the third embodiment.

While in the third and fourth embodiments the cell to be inserted between the WLBI pads is the power supply separation cell or the I/O cell having the electrode pad to be wire bonded, the cell to be inserted between the WLBI pads may be another cell so long as it includes a constituent element of the integrated circuit. Also in this case, the same effects as described in the third and fourth embodiments can be achieved.

Embodiment 5

FIGS. 8(*a*) and 8(*b*) are schematic diagrams illustrating layout of a peripheral portion of a semiconductor device according to a fifth embodiment of the present invention. In these figures, the same reference numerals as those shown in FIG. 7 designate the same or corresponding parts.

In FIG. 8(*a*), WLBI pads 71*a* and 71*b* are pads that are connected to different power supplies, and more particularly, the WLBI pad 71*a* is connected to a first circuit block 101 in a core region 12 while the WLBI pad 71*b* is connected to a second circuit block 102 in the core region 12.

In FIG. 8(*b*), the WLBI pad 71 is connected to the first circuit block 101 and the second circuit block 102 in the core region 12, and an electrode pad 91 to be wire bonded is connected to the first circuit block 101 and the second circuit block 102 in the core region 12.

The fifth embodiment of the present invention relates to a layout of WLBI pads of a semiconductor device having multiple power supply systems. For example, in the case where an analog power supply and ground, and a digital power supply and ground are used as different power supplies in a single semiconductor integrated circuit, even when the different power supplies apply the same voltage, these power supplies are often separated from each other in the semiconductor integrated circuit as shown in FIG. 8(*a*).

When the two WLBI pads 71*a* and 71*b* to which the same voltage is applied from different power supplies are disposed adjacent to each other, it is examined whether or not the same power supply can be used as the power supplies for the first circuit block 101 and the second circuit block 102 inside the core region, during WLBI and practical use. When the result of examination is that no influence of noise and no problem of allowable current amount occur and thereby it is determined that the same power supply can be used in the core region 12, the first circuit block 101 and the second circuit block 102 are connected to the WLBI pad 71*a*. Then, the WLBI pad 71*b* is replaced with the I/O cell 90 having the electrode pad 91 smaller than the WLBI pad, and the electrode pad 91 is connected to the first circuit block 101 and to the second circuit block 102. Further, the space between the WLBI pad 71*a* and the electrode pad 91 is deleted so that the WLBI pad 71*a* and the electrode pad 91 are disposed close to each other.

Figure 8A:
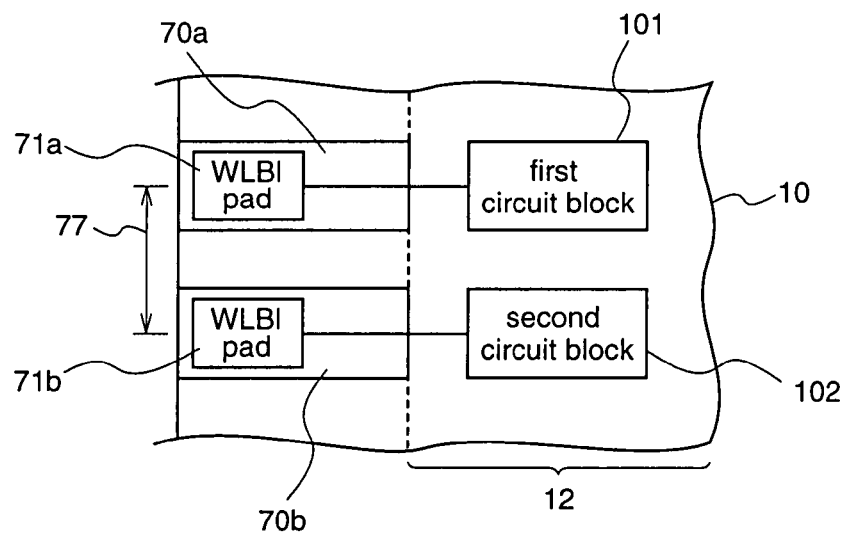
FIG. 8(a) is a schematic layout diagram illustrating a peripheral portion of a semiconductor device according to a fifth embodiment of the present invention.
Figure 8B:
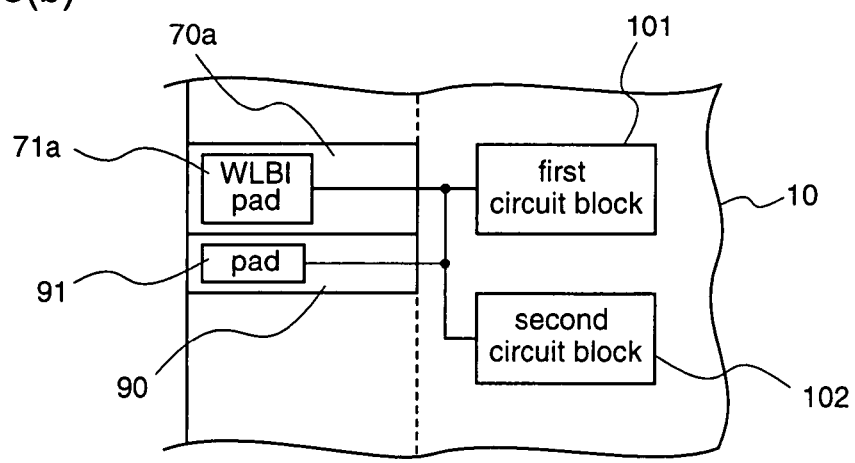
FIG. 8(b) is a schematic layout diagram of the peripheral portion of the semiconductor device according to the fifth embodiment of the present invention.

As described above, since the WLBI pad 71*b* is replaced with the electrode pad for wire bonding 91 which is smaller than the WLBI pad, the length of each side of the semiconductor substrate can be reduced by a width corresponding to a difference in sizes between the WLBI pad 71b and the electrode pad for wire bonding 91. Further, since it is not necessary to secure a space between the WLBI pad and the electrode pad for wire bonding because there is no restriction on WLBI, when the WLBI pads are disposed adjacent to each other as shown in FIG. 8(a), the space 77 that has been required due to the restriction on WLBI can be deleted.

As described above, according to the fifth embodiment, the WLBI pad 71a is disposed so as to be connected to the first and second circuit blocks 101 and 102 which are designed so that different powers or signals are applied thereto, and the electrode pad 91 to be wire bonded is disposed close to the WLBI pad 71a. Therefore, the WLBI pad 71b for supplying power or signal to the first and second circuit blocks 101 and 102 is deleted, and thereby the length of each side of the semiconductor substrate 10 is reduced, leading to a reduction in the chip size. Further, since the space between the WLBI pad 71a and the electrode pad 91 is deleted, the length of each side of the semiconductor substrate 10 can be reduced, leading to a reduction in the chip size.

While in this fifth embodiment two circuit blocks are connected to one WLBI pad and one electrode pad, the present invention is not restricted thereto, and three or more circuit blocks may be connected to one WLBI pad and one electrode pad, with the same effects as described for the fifth embodiment.

Embodiment 6

Figure 9A:
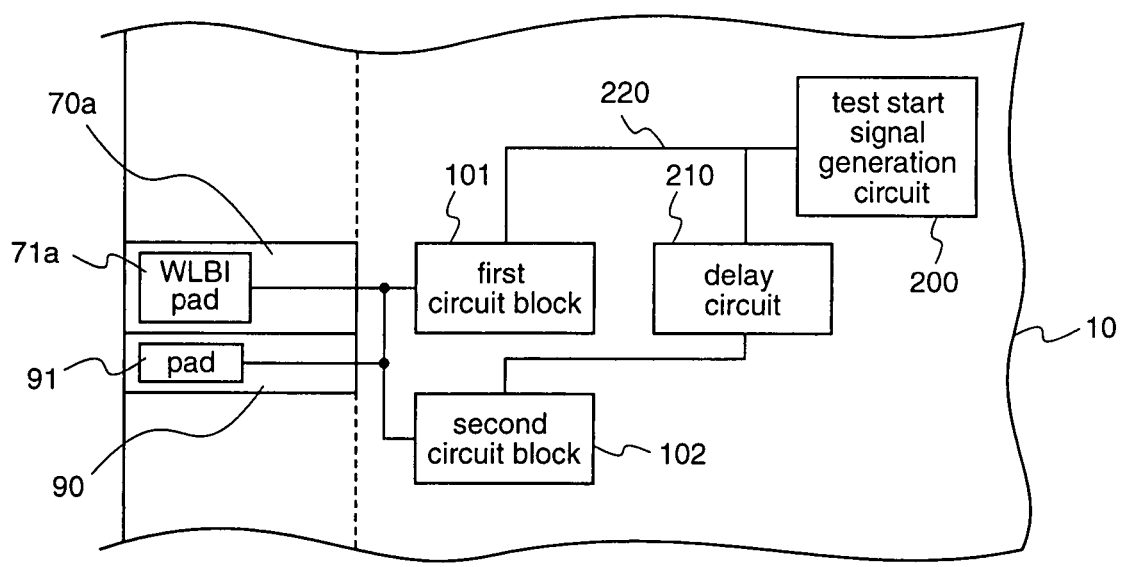
FIG. 9(a) is a schematic layout diagram illustrating a peripheral portion of a semiconductor device according to a sixth embodiment of the present invention.

FIG. 9(a) is a diagram illustrating the construction of a semiconductor device according to a sixth embodiment of the present invention. In FIG. 9(a), the same reference numerals as those shown in FIG. 8(b) designate the same or corresponding parts.

As shown in FIG. 9(a), in a core region 10, a first circuit block 101 is connected to a test start signal generation circuit 200, and a second circuit block 102 is connected through a delay circuit 210 to the test start signal generation circuit 220.

A test start signal 220 from the test start signal generation circuit 200 is inputted to the first circuit block 101. Further, the test start signal 220 delayed by the delay circuit 210 is inputted to the second circuit block 102.

Figure 9B:
FIG. 9(b) is a diagram for explaining the operation of the semiconductor device according to the sixth embodiment of the present invention.
Figure 9C:
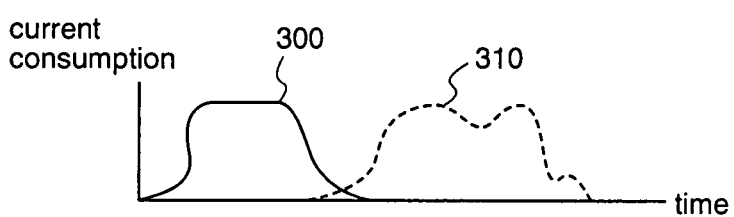
FIG. 9(c) is a diagram for explaining the operation of the semiconductor device according to the sixth embodiment of the present invention.

FIG. 9(b) and FIG. 9(c) are diagrams for explaining the operating states of the circuit blocks of the semiconductor device shown in FIG. 9(a) during WLBI, wherein the abscissa shows time, the ordinate shows current consumption, solid line 300 shows the relationship between time and power consumption of the first circuit block 101, and dotted line 310 shows the relationship between time and power consumption of the second circuit block 102.

In a semiconductor device wherein two WLBI pads to which different powers are supplied are connected to different two circuit blocks, respectively, like the semiconductor device according to the fifth embodiment, when the WLBI pad 71a is commoditized as shown in FIG. 9(a) and current is supplied from the commoditized WLBI pad 71a to the different two blocks, i.e., the first circuit block 101 and the second circuit block 102, to drive these two circuit blocks simultaneously, the allowable current amount of the single WLBI pad 71a might be exceeded during WLBI because the power supply is commoditized, leading to a risk of metal dissolution. For example, since, as shown in FIG. 9(b), the first circuit block 101 and the second circuit block 102 are operated in the same time zone to compensate the current, the current compensation in the time zone where the first circuit block 101 and the second circuit block 102 are operated is obtained by adding the current consumption of the first circuit block 101 to the current consumption of the second circuit block 102.

Therefore, in this sixth embodiment, the first circuit block 101 and the second circuit block 102 which are different blocks during WLBI in the semiconductor device of the fifth embodiment are time-divisionally operated with respect to the power or signal supplied from the WLBI pad 71a, that is, the operating time zones of the first circuit block 101 and the second circuit block 102 are made different from each other.

The first circuit block 101 and the second circuit block 102 are operated on the basis of the test start signal 220 from the test start signal generation circuit 200. At this time, the test start signal 220 from the test start signal generation circuit 200 is directly inputted to the first circuit block 101, while the test start signal 220 delayed by the delay circuit 210 is inputted to the second circuit block 102, and therefore, the second circuit block 102 is operated behind the first circuit block 101. In this way, the time zones where the first circuit block 101 and the second circuit block 102 are operated during WLBI can be controlled so as to be different from each other.

Since the first circuit block 101 and the second circuit block 102 are time-divisionally operated as shown in FIG. 9(c), the period during which the circuit blocks 101 and 102 are simultaneously operated is reduced to satisfy the allowable current amount, resulting in an increase in reliability.

As described above, according to the sixth embodiment, the semiconductor device according to the fifth embodiment is further provided with the test start signal generation circuit 200 for generating a test start signal that instructs start of acceleration test for the first and second circuit blocks 101 and 102, and the delay circuit 210 for delaying the test start signal, and the test start signal 220 from the test start signal generation circuit 200 is inputted to the first circuit block 101 while the test start signal 220 delayed by the delay circuit 210 is inputted to the second circuit block 102, whereby the operating time zones of the first circuit block 101 and the second circuit block 102 which are connected to the single WLBI pad 71a are made different from each other. Therefore, the amount of current that flows in the WLBI pad 71a during WLBI is controlled so as to satisfy the allowable current amount of the pad, whereby breakage of the semiconductor device such as destruction of the power supply wiring is prevented, leading to an increase in the operation reliability.

While in this sixth embodiment the time zones where the two circuit blocks connected to the single WLBI pad are operated are made different from each other, the present invention is not restricted thereto, and the operating time zones of three or more circuit blocks connected to the signal WLBI pad may be made different from each other, with the same effects as described for the fifth embodiment.

Embodiment 7

Figure 10:
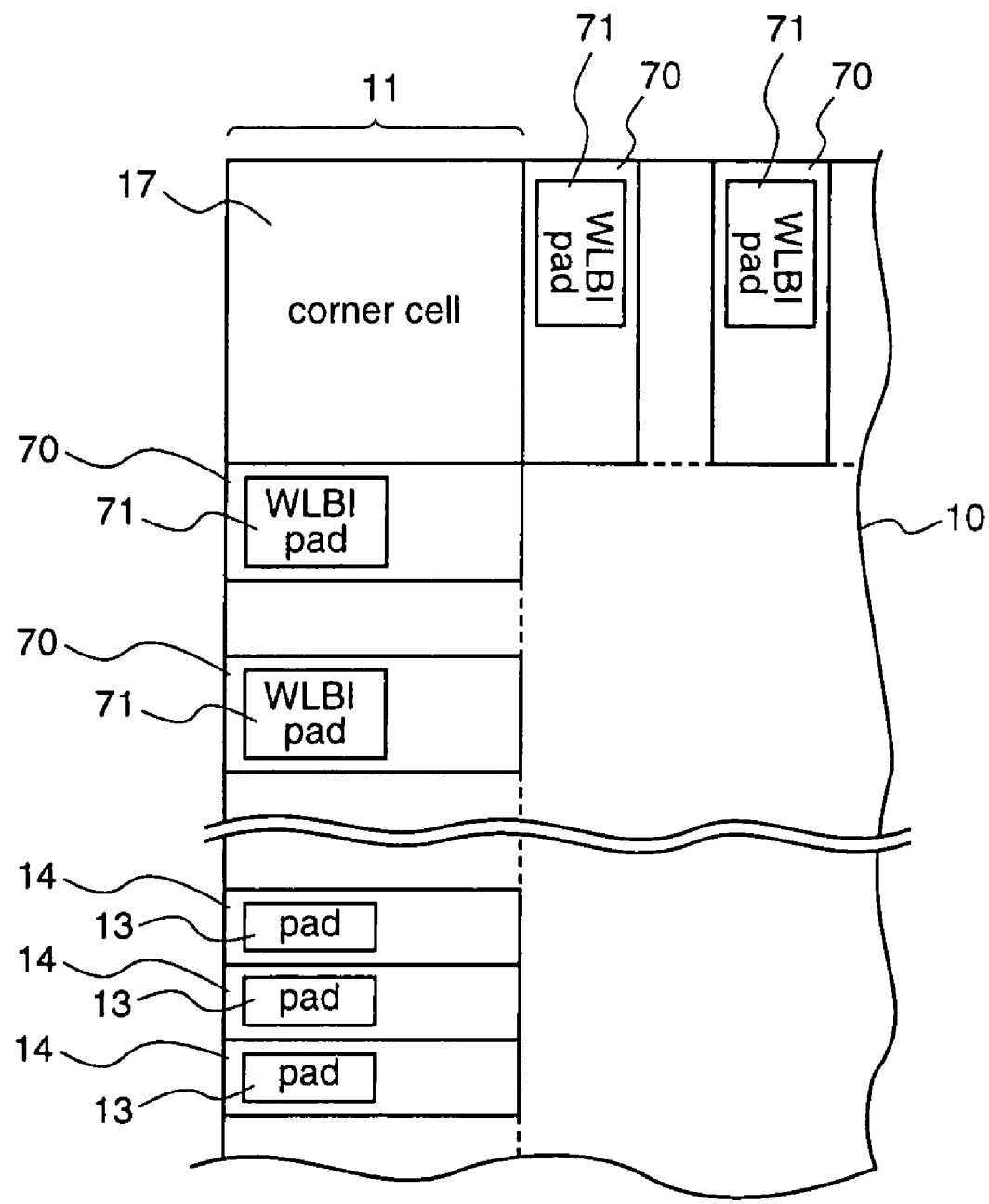
FIG. 10 is a schematic layout diagram illustrating a corner portion and a peripheral portion of a semiconductor device according to a seventh embodiment of the present invention.
Figure 11:
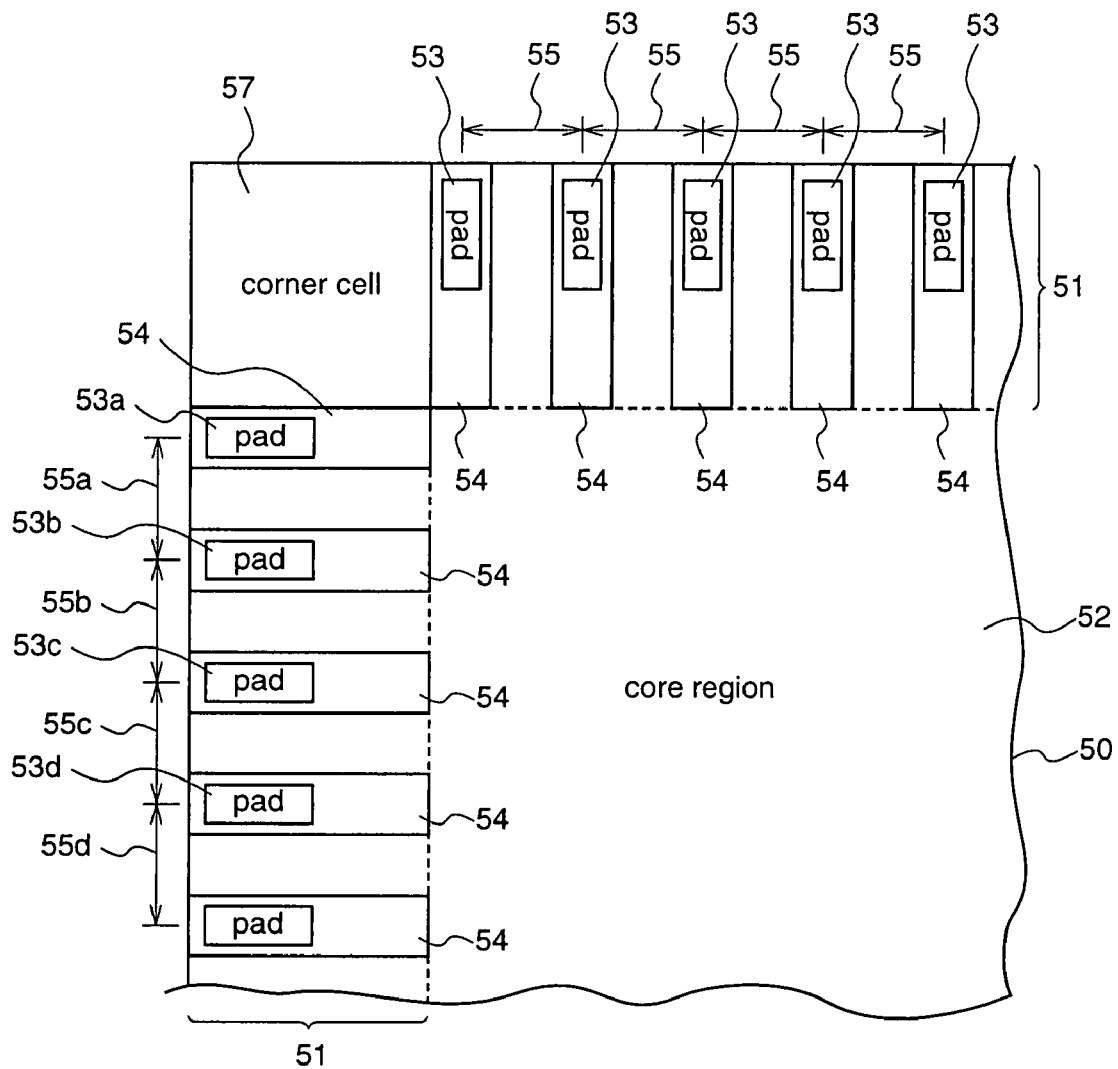
FIG. 11 is a schematic layout diagram illustrating a corner portion of a conventional semiconductor device.
Figure 12:
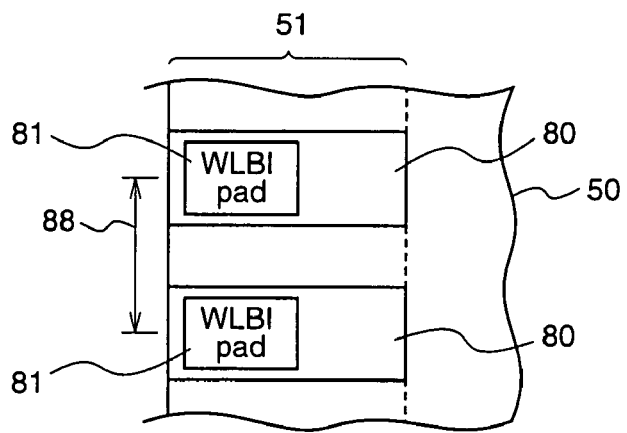
FIG. 12 is a schematic layout diagram illustrating a peripheral portion of another conventional semiconductor device.

FIG. 10 is a schematic diagram illustrating a layout of a corner portion and a peripheral portion of a semiconductor device according to a seventh embodiment of the present invention. In FIG. 7, the same reference numerals as those shown in FIGS. 1 and 6 designate the same or corresponding parts.

In the semiconductor device according to the seventh embodiment, plural WLBI pads 71 and plural electrode pads 13 to be wire bonded are disposed in the I/O region 11, and the WLBI pads 71 are disposed closer to the corner than the electrode pads 13.

When the electrode pads 13 that need wire bonding are adjacently disposed in the vicinity of the corner of the semiconductor substrate, the adjacent electrode pads 13 must be disposed with a space between them due to the restriction on wire bonding as described above. However, when the electrode pads 13 are disposed in a region other than the vicinity of the corner, the adjacent electrode pads 13 are not required to have a space between them. Accordingly, it is advantageous that the electrode pads 13 which need wire bonding should be disposed in a region other than the corner, in view of reducing the chip size.

On the other hand, the WLBI pads 71 must be disposed with a space between them regardless of whether they are disposed in the vicinity of the corner or in other region, and this space is determined by the restriction on the probe card or the like, and therefore, there is no considerable difference between the vicinity of the corner and other region.

Accordingly, the plural WLBI pads 71 with the spaces between them being not varied depending on the place where they are disposed, are disposed in the region close to the corner, while the plural electrode pads 13 with the spaces between them being increased in the vicinity of the corner, are disposed apart from the corner. Thereby, it becomes unnecessary to secure spaces between the adjacent electrode pads 13, and the length of each side of the semiconductor device 10 can be reduced by the spaces between the adjacent electrode pads, which spaces are needed when the electrode pads 13 are disposed in the vicinity of the corner.

As described above, according to the seventh embodiment, plural WLBI pads 71 and plural electrode pads 13 to be wire bonded are disposed on the I/O region 11, and the WLBI pads 71 are disposed in the vicinity of the corner while the electrode pads 13 are disposed apart from the corner, whereby the length of each side of the semiconductor substrate 10 can be reduced, leading to a reduction in the chip size.

APPLICABILITY IN INDUSTRY

The present invention is useful as a semiconductor device having an integrated circuit, and more particularly, it is useful as a semiconductor device having a high-density integration circuit that is fabricated using micro processing.

The invention claimed is:

1. A semiconductor device having an integrated circuit on a semiconductor substrate, wherein
    one electrode pad for acceleration test is disposed along the periphery of the semiconductor substrate so that the electrode pad is connected to plural circuits in the integrated circuit which are designed so as to be supplied with different powers or signals;
    one electrode pad for wire bonding to be connected to the plural circuits is disposed adjacent to the one electrode pad for acceleration test, along the periphery of the semiconductor substrate; and
    the semiconductor device further includes:
    a test start signal generation circuit for generating a test start signal which instructs a start of an acceleration test for the plural circuits, the test start signal generation circuit being disposed on the semiconductor substrate; and
    a delay circuit for delaying the generated test start signal;
    wherein the plural circuits include a first circuit to which the test start signal from the test start signal generation circuit is inputted, and a second circuit to which the test start signal delayed by the delay circuit is inputted, and the first circuit and the second circuit operate in different time zones during the acceleration test.

2. A semiconductor device having an integrated circuit on a semiconductor substrate, wherein
    plural electrode pads for wire bonding are disposed mutually with predetermined spaces, which are larger than a value satisfying restriction in assembly on such electrode pads for wire bonding, between the plural electrode pads, along the periphery of the semiconductor substrate in the vicinity of the corners thereof;
    static electricity discharge protection circuits are disposed in the spaces between the respective electrode pads for wire bonding; and
    each of the static electricity discharge protection circuits has an input from the integrated circuit and an output to the integrated circuit, and is not directly connected to the plural electrode pads for wire bonding.

3. The semiconductor device as defined in claim 2, further comprises an alternative electrode pad for wire bonding disposed adjacent to one of the plural electrode pads for wire bonding, wherein
    said alternative electrode pad or said one of the plural electrode pad is to be selectively wire bonded.

4. A semiconductor device having an integrated circuit on a semiconductor substrate, wherein
    plural electrode pads for acceleration test are disposed mutually with predetermined spaces, which are larger than a value satisfying restriction in assembly on such electrode pads for acceleration test, between the plural electrode pads, along the periphery of the semiconductor substrate;
    static electricity discharged protect circuit is disposed in the spaces between the respective electrode pads for acceleration test; and
    each of the static electricity discharge protection circuits has an input from the integrated circuit and an output to the integrated circuit, and is not directly connected to the plural electrode pads for wire bonding.

5. The semiconductor device as defined in claim 4, wherein electrode pads for wire bonding are disposed between the respective plural electrode pads for acceleration test which are disposed mutually with the predetermined spaces.

6. A semiconductor device having an integrated circuit on a semiconductor substrate, wherein
    one electrode pad for acceleration test is disposed along the periphery of the semiconductor substrate so that the electrode pad is connected to plural circuits in the integrated circuit which are designed so as to be supplied with different powers or signals;
    one electrode pad for wire bonding to be connected to the plural circuits is disposed adjacent to the one electrode pad for acceleration test, along the periphery of the semiconductor substrate;
    a test start signal generation circuit for generating a test start signal which instructs start of an acceleration test for the plural circuits; and
    a delay circuit for delaying the generated test start signal, wherein:
    the plural circuits include a first circuit to which the test start signal from the test start signal generation circuit is inputted, and a second circuit to which the test start signal delayed by the delay circuit is inputted, and
    the first circuit and the second circuit operate in different timing during the acceleration test.

* * * * *